(12) United States Patent
Kim et al.

(10) Patent No.: US 11,315,986 B2
(45) Date of Patent: Apr. 26, 2022

(54) TOUCH DISPLAY DEVICE

(71) Applicant: LG Display Co., Ltd., Seoul (KR)

(72) Inventors: CheolSe Kim, Gangwon-do (KR); JuHan Kim, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/726,609

(22) Filed: Dec. 24, 2019

(65) Prior Publication Data
US 2020/0212116 A1    Jul. 2, 2020

(30) Foreign Application Priority Data

Dec. 28, 2018 (KR) .................... 10-2018-0172867

(51) Int. Cl.
*G06F 3/041* (2006.01)
*G02F 1/133* (2006.01)
(Continued)

(52) U.S. Cl.
CPC .......... *H01L 27/323* (2013.01); *G06F 3/0445* (2019.05); *H01L 27/3246* (2013.01);
(Continued)

(58) Field of Classification Search
CPC ..... H01L 27/323–3276; H01L 51/5225; G06F 3/0445; G06F 2203/04112; G06F 3/04164; G02F 1/13394
See application file for complete search history.

(56) References Cited

U.S. PATENT DOCUMENTS 10,942,590 B2 *   3/2021  Jeong .................... G06F 3/0412
2009/0256812 A1 * 10/2009  Ha ........................ G06F 3/045
                                                            345/173
(Continued)

FOREIGN PATENT DOCUMENTS

CN    205353991 U      6/2016
CN    207834302 U  *   9/2018  ............. H01L 27/32
(Continued)

OTHER PUBLICATIONS

Japanese Office Action dated Dec. 8, 2020 issued in corresponding Patent Application No. 2019-227453 (4 pages).
(Continued)

*Primary Examiner* — Lin Li
(74) *Attorney, Agent, or Firm* — Polsinelli PC (57) ABSTRACT

A touch display device comprises a substrate; planarization film disposed over the substrate; an anode electrode and a touch metal disposed on the planarization film; a bank disposed over the planarization film on which the anode electrode and the touch metal are disposed, and the bank including a first cavity exposing the anode electrode and a second cavity exposing the touch metal; an organic light emitting layer disposed in the first cavity and disposed over the anode electrode; and a cathode electrode disposed over the organic light emitting layer and the bank, wherein the cathode electrode includes a first cathode electrode and a second cathode electrode, which are separated from each other, and a part of the first cathode electrode is disposed in the second cavity and connected to the touch metal in the second cavity.

15 Claims, 10 Drawing Sheets

(51) Int. Cl.
*H01L 27/32* (2006.01)
*H01L 51/52* (2006.01)
*G06F 3/044* (2006.01)

(52) U.S. Cl.
CPC ...... *H01L 27/3276* (2013.01); *H01L 51/5225* (2013.01); *G06F 2203/04112* (2013.01)

(56) References Cited

U.S. PATENT DOCUMENTS

| | | | |
|---|---|---|---|
| 2012/0105341 A1* | 5/2012 | Park | G06F 3/042 345/173 |
| 2013/0020564 A1* | 1/2013 | Kobayashi | H01L 27/3283 257/40 |
| 2016/0349899 A1 | 12/2016 | Hwang et al. | |
| 2017/0060302 A1 | 3/2017 | Yang et al. | |
| 2017/0075450 A1* | 3/2017 | Wang | G06F 3/04184 |
| 2017/0090615 A1 | 3/2017 | Bohannon et al. | |
| 2017/0269783 A1 | 9/2017 | Yang et al. | |
| 2017/0371464 A1 | 12/2017 | Nakanishi | |
| 2018/0004343 A1 | 1/2018 | Shin | |
| 2018/0006106 A1* | 1/2018 | Oh | H01L 27/3262 |
| 2018/0052552 A1 | 2/2018 | Tsai | |
| 2018/0143721 A1 | 5/2018 | Matsueda et al. | |
| 2018/0211998 A1 | 7/2018 | Hideo et al. | |
| 2018/0239488 A1* | 8/2018 | Lin | G06F 3/04166 |
| 2018/0348906 A1* | 12/2018 | Hwang | G06F 3/0446 |
| 2019/0157355 A1* | 5/2019 | Ye | H01L 27/3248 |
| 2020/0012371 A1 | 1/2020 | Yang et al. | |
| 2020/0124906 A1* | 4/2020 | Waka | G02F 1/13394 |

FOREIGN PATENT DOCUMENTS

| | | |
|---|---|---|
| CN | 109032403 A | 12/2018 |
| WO | 2018/205649 A1 | 11/2018 |

OTHER PUBLICATIONS

Partial European Search Report dated Apr. 23, 2020 issued in corresponding Patent Application No. 19216408.5 (13 pages).
Extended European Search Report dated Jul. 24, 2020 issued in corresponding Patent Application No. 19216408.5 (14 pages).

* cited by examiner

TOUCH DISPLAY DEVICE

CROSS-REFERENCE TO RELATED APPLICATION

This application claims the priority benefit of Korean Patent Application No. 10-2018-0172867, filed on Dec. 28, 2018, which is hereby incorporated by reference in its entirety.

BACKGROUND

Field of the Disclosure

The present disclosure relates to a touch display device.

Description of the Background

As the information society has developed at a rapid rate, there is an increasing need for display devices employing advanced technologies and more efficient methods. Recently, various types of display devices, such as a liquid crystal display (LCD) device, a plasma display panel (PDP) device, an organic light emitting display (OLED) device, or the like, have been developed and utilized.

Such display devices have been developed from typical input devices relying on a button, a keyboard, or a mouse, and provides a touch-based input interface that enables a user to easily input information or a command intuitively and conveniently. In order to provide a touch-based input interface by such a touch-based display device, it is necessary to detect the presence or absence of a user's touch on a display panel and detect correctly touch coordinates corresponding to the position of the touch on the display panel. There has been an increasing need for a capacitive sensing scheme enabling the presence or absence of a touch, touch coordinates, or the like to be detected based on a change in capacitance between touch electrodes or a change in capacitance between a touch electrode and a user associated medium (e.g., a stylus pen or part of a user's body), over the display panel of the display device including a plurality of touch electrodes (e.g., electrodes arranged in a row and electrodes arranged in a column).

A display device capable of providing a touch-based input interface may be referred to as a touch display device. As needed, a touch panel can be disposed in an area corresponding to the location of a display panel. This scenario enables the location of the touch panel to be understood intuitively, and display device to be operated according to a touch on an intuitive location, however, in case the touch panel is disposed on the display panel, the thickness of the display device is increased, and a process is needed for disposing the touch panel on the display panel. In addition, there is a problem in that such a touch panel causes increased power consumption of the display device.

SUMMARY

Accordingly, the present disclosure is directed to a touch display device that substantially obviates one or more problems due to limitations and disadvantages of the prior art.

More specifically, the present disclosure provides a touch display device capable of sensing a touch and being implemented in a thinner structure.

In addition, the present disclosure provides a touch display device capable of reducing power consumption.

In accordance with one aspect of the present disclosure, a touch display device is provided that includes: a substrate, a planarization film disposed over the substrate, an anode electrode and a touch metal disposed on the planarization film, a bank disposed over the planarization film on which the anode electrode and the touch metal are disposed, and including a first cavity exposing the anode electrode and a second cavity exposing the touch metal, an organic light emitting layer disposed in the first cavity and disposed over the anode electrode, and a cathode electrode disposed over the organic light emitting layer and the bank, wherein the cathode electrode includes a plurality of cathode electrodes separated from each other, and a part of at least one of the plurality of separated cathode electrodes is disposed in the second cavity and connected to the respective touch metal in the second cavity.

The touch display device may include a plurality of pixels, each of the plurality of pixels including: a first transistor for generating a first current in response to a data signal, a second transistor for transferring the data signal to the first transistor in response to a gate signal, a storage capacitor for holding the data signal transferred to the first transistor, and an organic light emitting diode for emitting light by the first current from the first transistor. In some aspects, the touch display device is configured to: transfer the data signal and the gate signal to a data line and a gate line, respectively, during a first interval, transfer a touch driving signal to the cathode electrode of the organic light emitting diode during a second interval, and during the second interval, transfer a load free driving signal in synchronism with the touch driving signal to at least one of the data line, the gate line, and a power supply line, in order to make a second current flow through the cathode electrode.

In accordance with aspects of the present disclosure, it is possible to provide a touch display device capable of sensing a touch and being implemented in a thinner structure.

In accordance with aspects of the present disclosure, it is possible to provide a touch display device capable of reducing power consumption.

Additional features and advantages of the disclosure will be set forth in the description which follows and in part will be apparent from the description, or may be learned by practice of the disclosure. The objectives and other advantages of the disclosure will be realized and attained by the structure particularly pointed out in the written description and claims hereof as well as the appended drawings.

BRIEF DESCRIPTION OF THE DRAWINGS

The accompanying drawings, which are included to provide a further understanding of the present disclosure and which are incorporated in and constitute a part of the disclosure, illustrate aspects of the present disclosure and together with the description serve to explain the principles of the present disclosure.

In the drawings.

DETAILED DESCRIPTION

The advantages and features of the present disclosure and methods of achieving the same will be apparent by referring to aspects of the present disclosure as described below in detail in conjunction with the accompanying drawings. However, the present disclosure is not limited to the aspects set forth below, but may be implemented in various different forms. The following aspects are provided only to complete the present disclosure and inform those skilled in the art of the scope of the present disclosure, as defined by the appended claims.

In addition, the shapes, sizes, ratios, angles, numbers, and the like illustrated in the accompanying drawings for describing the exemplary aspects of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some aspects of the present disclosure rather unclear. The terms such as "including", "having", "containing", "comprising of", and "consist of" used herein are generally intended to allow other components to be added unless the terms are used with the term "only". As used herein, singular forms are intended to include plural forms unless the context clearly indicates otherwise.

In interpreting any elements or features of the aspects of the present disclosure, it should be considered that any dimensions and relative sizes of layers, areas and regions include a tolerance or error range even when a specific description is not conducted.

Terms, such as first, second, A, B, (A), or (B) may be used herein to describe elements of the disclosure. Each of the terms is not used to define essence, order, sequence, or number of an element, but is used merely to distinguish the corresponding element from another element. When it is mentioned that an element is "connected" or "coupled" to another element, it should be interpreted that another element may be "interposed" between the elements or the elements may be "connected" or "coupled" to each other via another element as well as that one element is directly connected or coupled to another element. Spatially relative terms, such as, "on", "over", "above", "below", "under", "beneath", "lower", "upper", "near", "close", "adjacent", and the like, may be used herein to describe one element or feature's relationship to another element(s) or feature(s) as illustrated in the figures, and it should be interpreted that one or more elements may be further "interposed" between the elements unless the terms such as "directly", "only" are used.

Any elements or features of the aspects of the present disclosure are not limited to a specific meaning of the terms described above. The terms as used herein are merely for the purpose of describing examples and are not intended to limit the present disclosure. Although the terms "first", "second", and the like are used for describing various elements, or features, these elements are not confined by these terms. These terms are merely used for distinguishing one element from other elements. Therefore, a first element to be mentioned below may be a second element in a technical concept of the present disclosure.

The elements or features of various exemplary aspects of the present disclosure can be partially or entirely bonded to or combined with each other and can be interlocked and operated in technically various ways as can be fully understood by a person having ordinary skill in the art, and the various exemplary aspects can be carried out independently of or in association with each other.

Hereinafter, exemplary aspects of the present disclosure will be described in detail with reference to the accompanying drawings.

Figure 1:
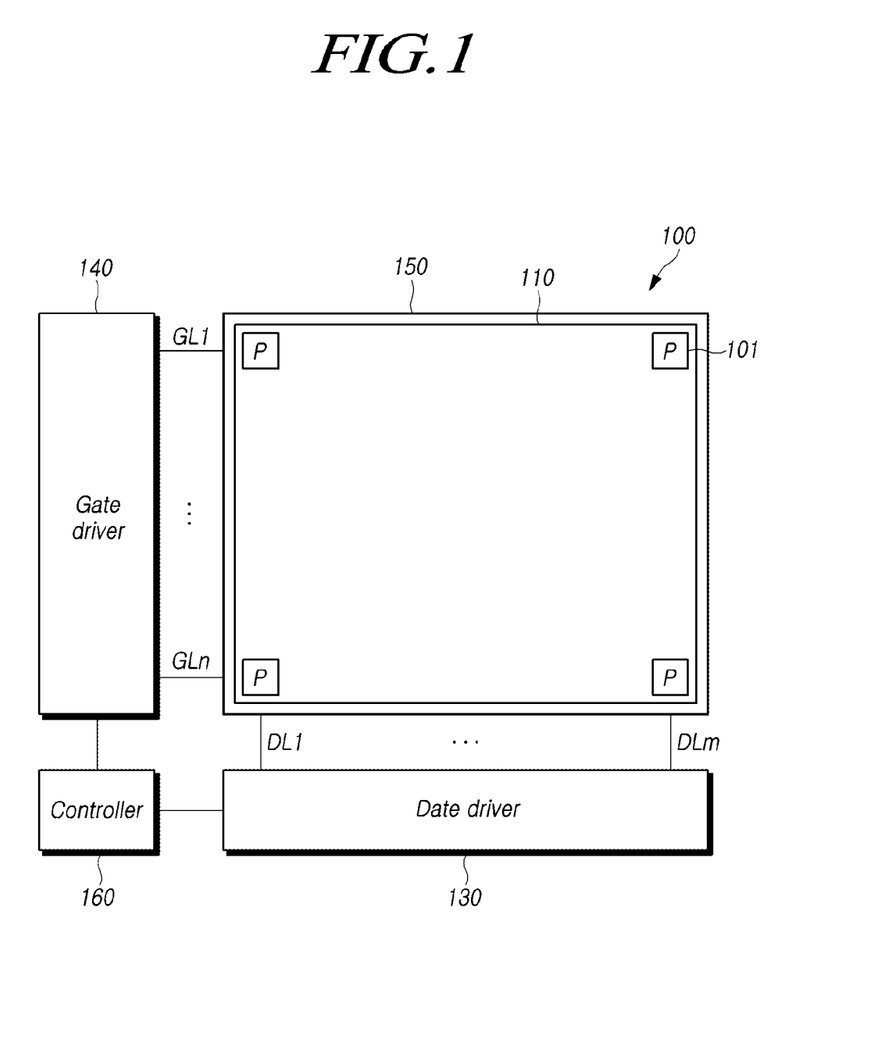
FIG. 1 is a diagram schematically illustrating a touch display device to which the present disclosure may be applied.

FIG. 1 is a diagram schematically illustrating a touch display device to which the present disclosure may be applied.

Referring to FIG. 1, the touch display device includes a display panel 110, a data driver 130, a gate driver 140, a touch sensor 150, and a controller 160.

The display panel 110 can include a plurality of gate lines (GL1, . . . , GLn) and a plurality of data lines (DL1, . . . , DLm), which intersect each other at a predetermined angle. The display panel 110 can include a plurality of pixels 101 arranged to be corresponded to an area in which the plurality of gate lines (GL1, . . . , GLn) and the plurality of data lines (DL1, . . . , DLm) intersect each other. The plurality of pixels 101 can include a plurality of subpixels emitting light, such as red light, green light, blue light, white light, or the like. However, aspects of the present disclosure are not limited thereto.

Each of the plurality of subpixels can include an organic light emitting diode and a pixel circuit supplying a first current to the organic light emitting diode. The pixel circuit is connected to the plurality of gate lines (GL1, . . . , GLn) and the plurality of data lines (DL1, . . . , DLm), and can supply the first current to the organic light emitting diode. Lines disposed in the display panel 110 are not limited to the gate lines (GL1, . . . , GLn) and the data lines (DL1, . . . , DLm).

The data driver 130 can apply at least one data signal to the plurality of data lines (DL1, . . . , DLm). The data signal may correspond to gray scale, and a voltage level of a data signal may be determined depending on the corresponded gray scale. A voltage of the data signal may be referred to as a data voltage.

It is noted that a single data driver 130 is illustrated in FIG. 1, but aspects of the present disclosure are not limited thereto. The number of data drivers may be determined depending on the size or resolution of the display panel 110. In addition, the data driver 130 may be implemented as an integrated circuit.

The gate driver 140 can apply at least one gate signal to the plurality of gate lines (GL1, . . . , DLm). At least one pixel 101 corresponding to the plurality of gate lines (GL1, . . . , GLn) to which the at least one gate signal is applied can received the at least one data signal. Further, the gate driver 140 can transfer a sensing signal to at least one pixel 101. The pixel 101 received the sensing signal outputted from the gate driver 140 can receive a sensing voltage outputted from the data driver 130. It is noted that a single gate driver 140 is illustrated in FIG. 1, but aspects of the present disclosure are not limited thereto. The number of gate drives may be at least two gate drives. Further, the gate driver 140 can include two gate drivers disposed on both sides of the display panel 110, and one can be connected to one or more odd numbered gate lines of the plurality of gate lines (GL1, . . . , GLn) and the other can be connected to one or more even numbered gate lines of the plurality of gate lines (GL1, . . . , GLn). However, aspects of the present disclosure are not limited thereto.

The gate driver 140 may be implemented as an integrated circuit. Further, the gate driver 140 can include a gate signal generating circuit, and a level shifter for applying a signal and/or a voltage to the gate signal generating circuit. The gate signal generating circuit can be disposed on the display panel 110.

The touch sensor 150 can output a touch sensing signal in response to a touch on the display panel 110. Herein, the touch can include, the contact of a touch object, such as a stylus pen or part of a user's body, with the display panel 110, as well as the approach of the touch object to the display panel 110 within a certain distance. The touch sensor 150 can include a plurality of touch electrodes, and a touch circuit processing a touch signal associated with the touch electrodes. The touch signal may be a touch driving signal and a touch sensing signal. The touch circuit can receive a touch sensing signal in response to a touch driving signal applied to the touch electrode, and output a voltage or current corresponding to the touch sensing signal.

The touch sensor 150 can include at least one touch line connecting between at least one touch electrode and the touch circuit. The touch sensor 150 can sense a change in a voltage charged to the touch electrode, and output a signal corresponding to the charged voltage. The touch sensor 150 can cause the touch electrode to receive a touch driving signal, charge a certain voltage, and output a touch sensing signal corresponding to the charged voltage. The touch circuit may be implemented as an integrated circuit.

The controller 160 can control the touch sensor 150. The controller 160 can supply a touch driving signal to the touch sensor 150, and can detect the location of a corresponding touch based on a touch sensing signal in response to the supplied touch driving signal. The controller 160 can control the data driver 130 and the gate driver 140. The controller 160 can transfer an image signal corresponding to a data signal to the data driver 130. The image signal may be a digital signal. The controller 160 can correct the image signal and then transfer the corrected image signal to the data driver 130. Herein, operations of the controller 160 are not limited thereto. The controller 160 can include the touch circuit. The controller 160 can include a timing controller. The touch circuit can control the touch sensor, and the timing controller can control the data driver 130 and the gate driver 140. Herein, configurations of the controller 160 of the present disclosure are not limited thereto. The controller 160 may be implemented as an integrated circuit.

Figure 2:
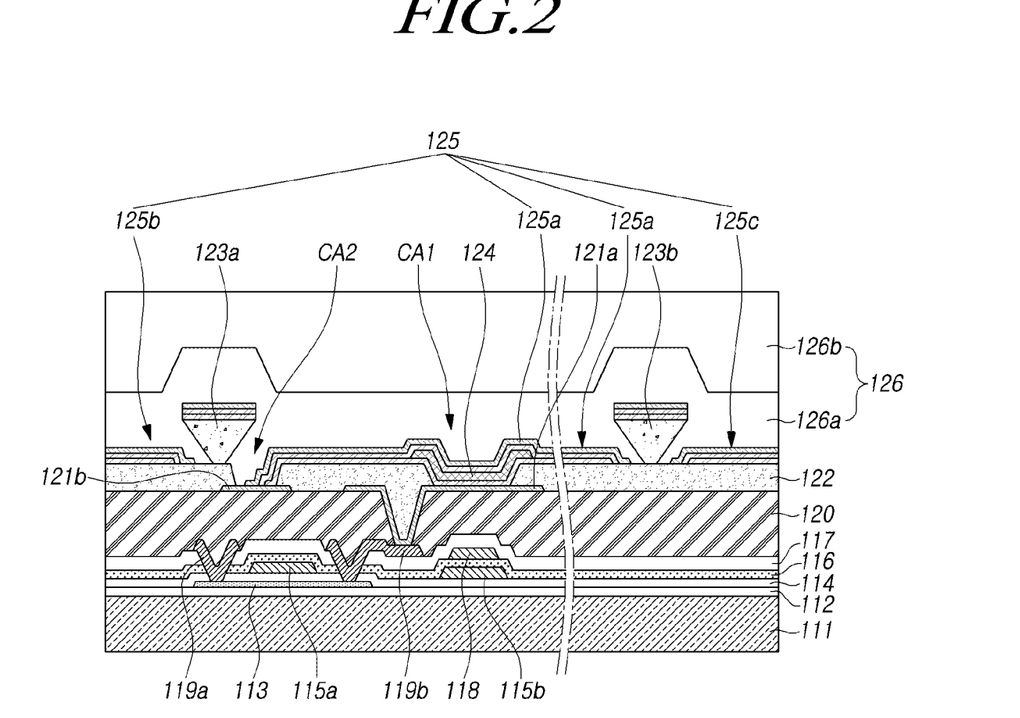
FIG. 2 is a cross-sectional diagram illustrating the display panel illustrated in FIG. 1.

FIG. 2 is a cross-sectional diagram illustrating the display panel illustrated in FIG. 1.

Referring to FIG. 2, the display panel 110 can include a substrate 111, a planarization film 120 disposed over the substrate 111, an anode electrode 121a and a touch metal 121b disposed on the planarization film 120, a bank 122 disposed over the planarization film on which the anode electrode 121a and the touch metal 121b are disposed, an organic light emitting layer 124 disposed over the anode electrode 121a, and a cathode electrode 125 disposed over the organic light emitting layer 124 and the bank 122.

The substrate 111 may include poly amide and/or polyethylene terephthalate (PET). The substrate 111 can include glass. However, aspects of the present disclosure are not limited thereto. A buffer layer 112 can be disposed on the substrate 111. An active layer 113 can be disposed on the buffer layer 112. The active layer 113 may be low temperature poly silicon. The active layer 113 may be an oxide semiconductor. However, aspects of the present disclosure are not limited thereto. A gate insulating film 114 can be disposed over the substrate 111 including the active layer 113. A first gate electrode 115a and a second gate electrode 115b can be formed by patterning after a gate metal has been disposed on the gate insulating film 114. The first gate electrode 115a can be disposed to overlap the active layer 113 on the gate insulating film 114. A first interlayer insulating film 116 can be disposed on the gate insulating film 114 on which the first gate electrode 115a and the second gate electrode 115b are disposed.

A conducting layer 117 can be patterned and disposed on the first interlayer insulating film 116. The conducting layer 117 can be disposed to overlap the second gate electrode 115b. A capacitor may be disposed over the substrate 111 by the conducting layer 117 and the second gate electrode 115b. A second interlayer insulating film 118 can be disposed on the first interlayer insulating film 116, and at least one contact hole can be formed in the first interlayer insulating film 116 and the second interlayer insulating film 118. The active layer 113 can be exposed through the contact hole. A source/drain metal is disposed and patterned on the conducting layer 117, and thus a source electrode 119a and a drain electrode 119b can be disposed thereon. The source electrode 119a and the drain electrode 119b can be contacted the active layer 113 through respective contact holes. A planarization film 120 can be disposed on the conducting layer 117 on which the source electrode 119a and the drain electrode 119b are disposed. A contact hole can be formed in the planarization film 120. The drain electrode 119b can be exposed through the contact hole.

An anode metal can be disposed and patterned on the planarization film 120. The anode electrode 121a and the touch metal 121b can be disposed on the planarization film 120 by the patterned anode metal. The anode electrode 121a can contact the drain electrode 119b through the contact hole. The bank 122 can be disposed over the planarization film 120 on which the anode electrode 121a and the touch metal 121b are disposed. A first cavity CA1 and a second cavity CA2 can be disposed in the bank 122, and the anode electrode 121a can be exposed through the first cavity CA1 and the touch metal 121b can be exposed through the second cavity CA2. One or more spacers 123a and 123b with a predetermined height can be disposed on the bank 122. The cross-section of the spacers 123a and 123b may have a shape tapering toward the bank 122. Herein, the shape of the spacers 123a and 123b is not limited thereto.

The first spacer 123a can be a spacer disposed adjacent to the second cavity CA2, and the second spacer 123b can be a spacer spaced apart from the second cavity CA2. An organic light emitting layer 124 can be disposed over the anode electrode 121a. The organic light emitting layer 124 can be formed of a plurality of stacked layers. One or more of the plurality of layers of the organic light emitting layer 124 can be disposed over the anode electrode 121a. In some aspects, the one or more of the plurality of layers can be disposed only over the anode electrode 121a. As another example, all the organic light emitting layer 124 can be disposed over the anode electrode 121a. However, aspects of the present disclosure are not limited thereto. The cathode electrode 125 can be disposed over the organic light emitting layer 124.

The organic light emitting layer 124 and the cathode electrode 125 can be disposed over the spacers 123a and 123b because upper portions of the spacers 123a and 123b have a predetermined width. On the other hand, the organic light emitting layer 124 and the cathode electrode 125 may not be disposed in areas in which the spacers 123a and 123b are disposed. In addition, since the spacers 123a and 123b have a predetermined height, the organic light emitting layer 124 and the cathode electrode 125 disposed over the bank 122 cannot be connected to the organic light emitting layer 124 and the cathode electrode 125 disposed over the spacers 123a and 123b, respectively. The cathode electrode 125 can be disposed to be divided into a plurality of cathode electrodes 125a, 125b and 125c. Accordingly, the cathode electrode 125 can be divided into a first cathode electrode 125a, a second cathode electrode 125b, and a third cathode electrode 125c, which are disposed over the bank 122 and spaced apart from one another.

The first cathode electrode 125a can be connected to the touch metal 121b in the second cavity CA2. The second cathode electrode 125b can be connected to another touch metal in another second cavity (not shown) Accordingly, the first cathode electrode 125a and the second cathode electrode 125b can receive respective touch signals from respective touch metals. The third cathode electrode 125c can be connected to yet another touch metal in yet another second cavity (not shown) Accordingly, the third cathode electrode 125c can receive respective touch signals from respective touch metals. The touch metal 121b can be included in a touch electrode line TEL to which a touch signal is transferred as illustrated in FIG. 3.

An encapsulation 126 can be disposed on the cathode electrode 125. However, aspects of the present disclosure are not limited thereto. The encapsulation 126 can be disposed on one or more side portions of the substrate 111, thus can seal elements and electrodes disposed over the substrate 111. The encapsulation 126 can include an organic film layer 126a and an inorganic film layer 126b. The encapsulation 126 cannot be disposed at least an area of the substrate 111. At least one pad delivering for a signal and/or a voltage can be disposed in the area in which the encapsulation 126 is not disposed.

Since the cathode electrode 125 is connected to the touch metal and used as the touch electrode, and a separate layer for sensing a touch over the substrate 111 is not required, therefore, it is possible to prevent the width of the display panel 110 from being greater. In addition, since the touch metal and the touch electrode are formed during the process of manufacturing display panel 110, an aligning process is not required and therefore it is possible to prevent related manufacturing process from being complicated even when the touch electrode is disposed on the display panel 110.

Figure 3:
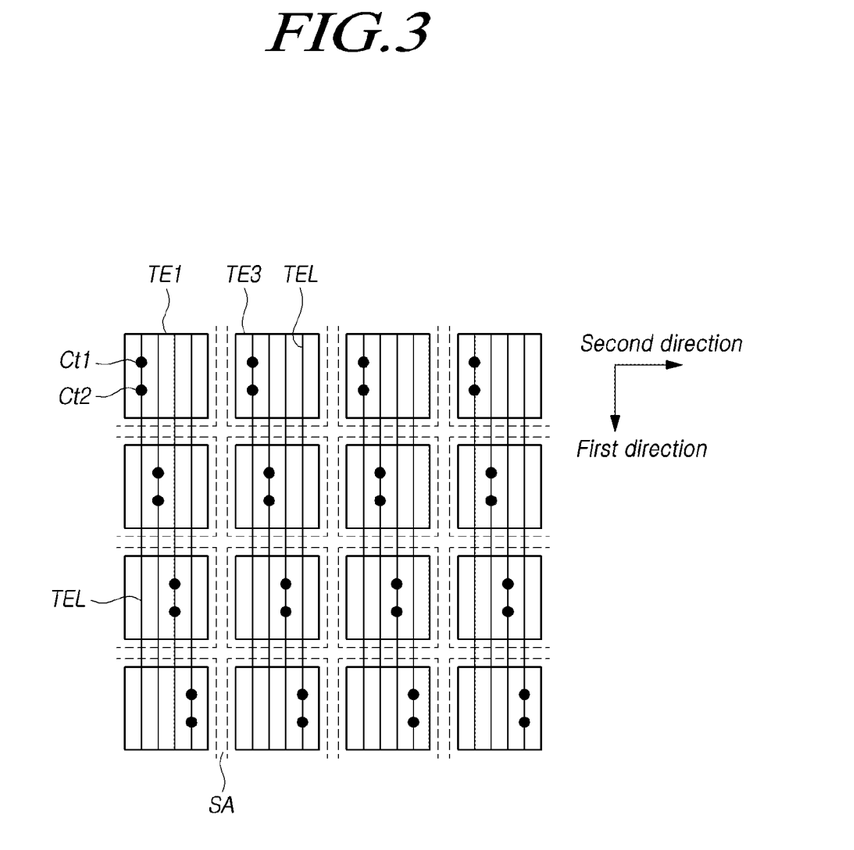
FIG. 3 is a diagram illustrating the touch sensor employed in the touch display device illustrated in FIG. 1.

FIG. 3 is a diagram illustrating the touch sensor employed in the touch display device illustrated in FIG. 1.

Referring to FIG. 3, a plurality of touch electrodes TE, and a plurality of touch electrode lines TEL connected to each touch electrode TE are disposed on the display panel 110. The plurality of touch electrodes TE can be disposed to be spaced apart from one another. Here, in FIG. 3, the plurality of touch electrodes TE are disposed such that 16 touch electrodes are disposed in a matrix form of 4*4, but aspects of the present disclosure are not limited thereto. Each of the plurality of touch electrode lines TEL can extend in a first direction. The first touch electrode TE1 can correspond to the first cathode electrode 125a illustrated in FIG. 2, and the third touch electrode TE3 spaced apart from the first touch electrode TE1 can correspond to the third cathode electrode 125c illustrated in FIG. 2. Each touch electrode TE can be connected to a different touch electrode line TEL from one another. Here, in FIG. 3, one touch electrode line TEL contacts one touch electrode TE at two points Ct1 and Ct2, but aspects of the present disclosure are not limited thereto. One touch electrode line TEL can be contacted one touch electrode TE at one point Ct1 or at two or more points. The two points Ct1 and Ct2 may be points at which the touch metal 121b illustrated in FIG. 2 is connected to the touch electrode TE. The spacer illustrated in FIG. 2 can be disposed between the touch electrodes TE. That is, the spacer can be disposed in an area SA in which the touch electrode TE is not disposed. Accordingly, the area SA in which the touch electrode TE is not disposed can extend in a first direction and in a second direction, between the touch electrodes TE. Further, a plurality of pixels 101 can correspond to one touch electrode TE. That is, a plurality of organic light emitting diodes can be disposed under one touch electrode TE.

Figure 4A:
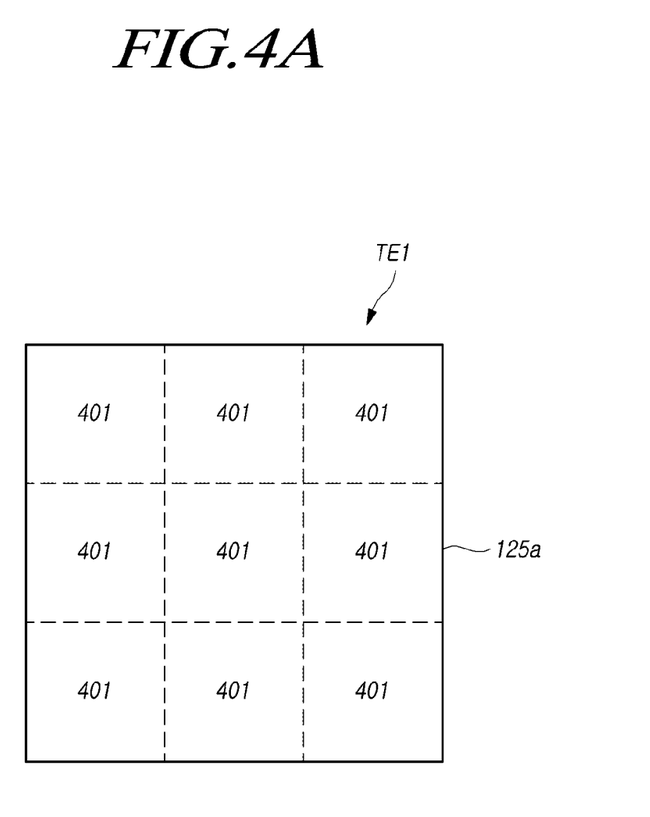
FIG. 4A is a diagram illustrating an example of the touch electrode illustrated in FIG. 3.
Figure 4B:
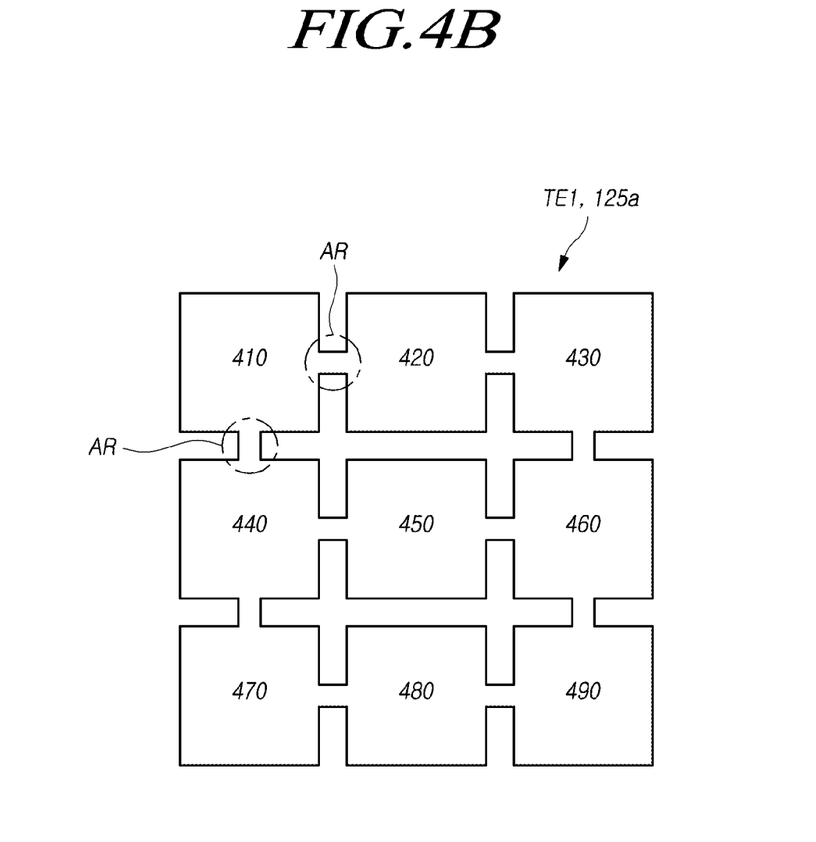
FIG. 4B is a diagram illustrating another example of the touch electrode illustrated in FIG. 3.

FIG. 4A is a diagram illustrating an example of the touch electrode illustrated in FIG. 3, and FIG. 4B is a diagram illustrating another example of the touch electrode illustrated in FIG. 3.

Referring to FIG. 4A, the first cathode electrode 125a can be disposed to be corresponded to one first touch electrode TE1. That is, the first cathode electrode 125a illustrated in FIG. 2 can correspond to the first touch electrode TE1. In addition, each of a plurality of boxes 401 represented by dotted lines in the first cathode electrode TE1 can correspond to each pixel 101. Accordingly, the plurality of pixels 101 can be corresponded to the first cathode electrode 125a. In addition, the first cathode electrode 125a is formed of one electrode body corresponding to the plurality of pixels 101; therefore can function as both a cathode electrode and a touch electrode being corresponded to the plurality of pixels 101.

Referring to FIG. 4B, the first touch electrode TE1 can include a plurality of divided cathode electrodes 410 to 490 disposed in pixel areas. The plurality of divided cathode electrodes 410 to 490 disposed in the pixel areas can correspond to the first cathode electrode 125a illustrated in FIG. 2. One of the divided cathode electrodes 410 to 490 can directly contact the touch metal 121b. Further, a part of the one of the divided cathode electrodes 410 to 490 disposed in the pixel areas can be connected to a part of another one of the divided cathode electrodes 410 to 490 through a connection electrode AR. Here, the connection electrode AR can be formed of the same material as the cathode electrode. Further, each of the plurality of divided cathode electrodes 410 to 490 disposed in the pixel areas can correspond to one pixel 101. However, aspects of the present disclosure are not limited thereto. Accordingly, each of the plurality of divided cathode electrodes 410 to 490 disposed in the pixel areas may correspond to a plurality of pixels. In addition, another spacer can be disposed between the plurality of divided cathode electrodes 410 to 490 disposed in the pixel areas, which correspond to one touch electrode TE. A spacer may not be disposed in an area in which the connection electrode AR is disposed.

Further, the divided cathode electrodes 410 to 490 disposed in the pixel areas can be transparent electrodes. Further, the divided cathode electrodes 410 to 490 disposed in the pixel areas can be in the form of a mesh.

Figure 5:
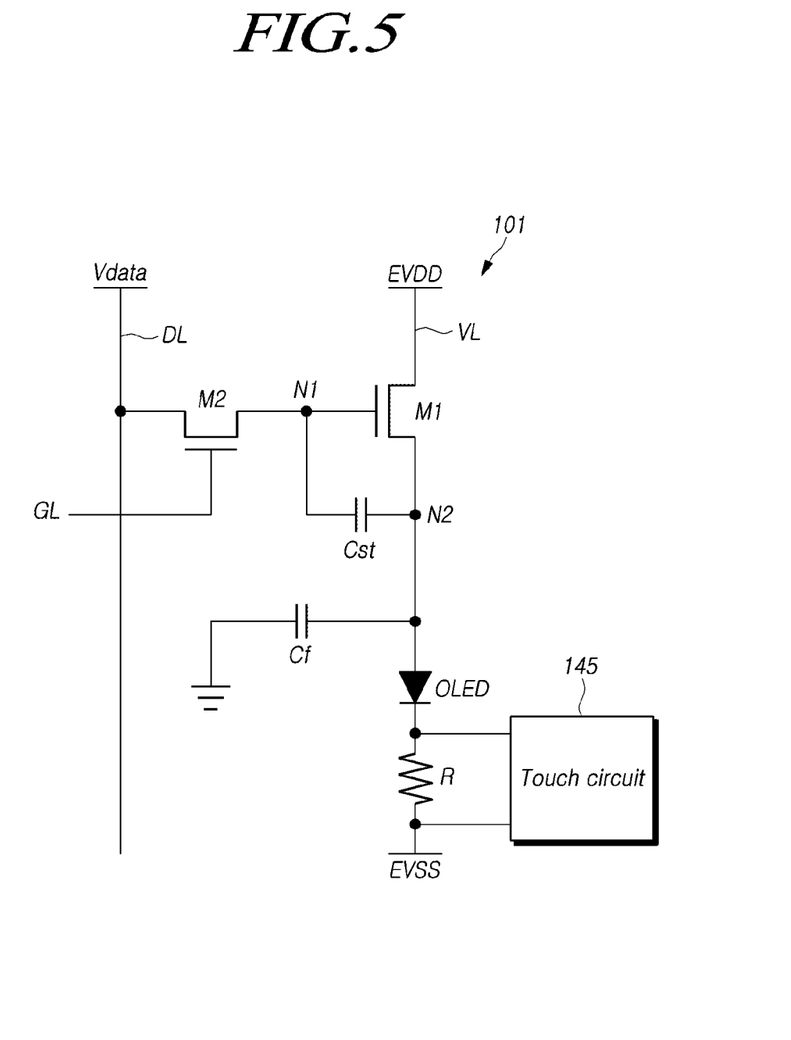
FIG. 5 is a circuit diagram illustrating the subpixel employed in the display panel illustrated in FIG. 1.

FIG. 5 is a circuit diagram illustrating the pixel employed in the display panel illustrated in FIG. 1.

Referring to FIG. 5, the pixel 101 can include: a first transistor M1 generating a first current in response to a data signal Vdata, a second transistor M2 transferring a data signal Vdata to the first transistor M1 in response to a gate signal, a storage capacitor Cst holding the data signal Vdata transferred to the first transistor M1, and an organic light emitting diode OLED emitting light by the first current received from the first transistor M1.

The gate electrode of the first transistor M1 can be connected to a first node N1, and a first electrode thereof can be connected to a first power supply line VL to which a first power supply EVDD is supplied, and a second electrode thereof can be connected to a second node N2. The first electrode can be the source electrode illustrated in FIG. 2, the second electrode can be the drain electrode illustrated in FIG. 2. However, aspects of the present disclosure are not limited thereto. A magnitude of the first current can be determined corresponding to a voltage difference between the gate electrode and the second electrode of the first transistor M1.

The gate electrode of the second transistor M2 can be connected to a gate line GL, and first and second electrodes thereof can be connected to a data line DL and the first node N1, respectively. Accordingly, a data signal flowing through the data line DL can be transferred to the first node N1 in response to a gate signal transferred through the gate line GL.

First and second electrodes of the storage capacitor Cst can be connected to the first and second nodes N1 and N2, respectively. The storage capacitor Cst can hold a voltage between the first node N1 and the second node N2. Accordingly, a voltage difference between the gate electrode and the second electrode of the first transistor M1 can be held during a certain interval, and the first current can therefore flow constantly.

The organic light emitting diode OLED can emit light depending on a current supplied to the second node N2. The cathode electrode of the organic light emitting diode OLED can correspond to the cathode electrode 125a, 125b, 125c illustrated in FIG. 2.

The touch circuit 145 can be connected to the cathode electrode of the organic light emitting diode OLED. The touch circuit 145 can detect the presence or non-presence of a touch using a magnitude of a current flowing corresponding to a magnitude of a resistance R connected between the cathode electrode of the organic light emitting diode and a second power supply EVSS.

Figure 6:
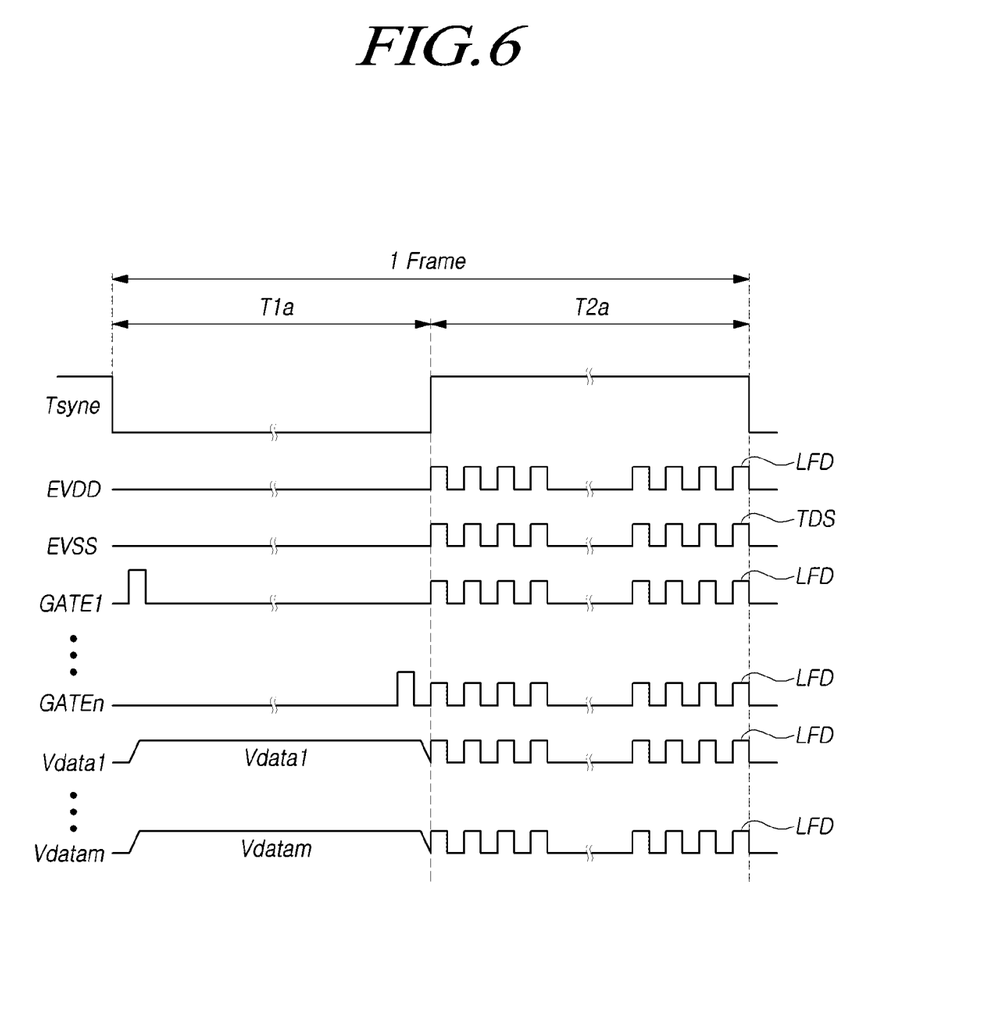
FIG. 6 is a timing chart illustrating a method of driving the display panel illustrated in FIG. 1.
Figure 7:
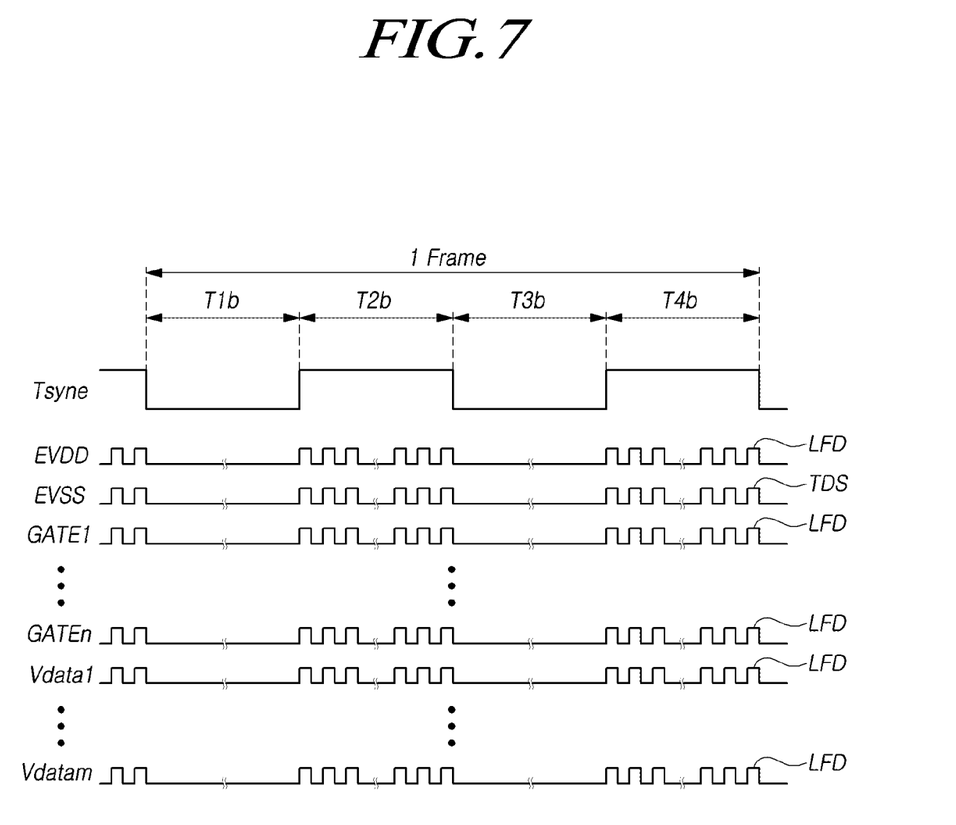
FIG. 7 is a timing chart illustrating another method of driving the display panel illustrated in FIG. 1.

FIG. 6 is a timing chart illustrating a method of driving the display panel illustrated in FIG. 1, and FIG. 7 is a timing chart illustrating another method of driving the display panel illustrated in FIG. 1.

A synchronization signal Tsync can repeat a high state and a low state. During an interval in which the synchronization signal Tsync is in the low state, the display panel 110 can operates as a display interval, and during an interval in which the synchronization signal Tsync is in the high state, the display panel 110 can operates as a touch interval.

Referring to FIG. 6, during a period of a frame, the synchronization signal Tsync can be divided into a first interval T1a corresponding to the interval in the low state and a second interval T2a corresponding to the interval in the high state. However, aspects of the present disclosure are not limited thereto. The first interval T1a and the second interval T2a can have an identical length, but aspects of the present disclosure are not limited thereto. In addition, the second interval T2a can correspond to a vertical blank interval. The vertical blank interval may be an interval during which a vertical synchronizing signal is input, or may be an interval between one frame and the next frame.

In the first interval T1a, a data signal and a gate signal can be transferred to the data line DL and the gate line GL, respectively. Accordingly, the pixel 101 illustrated in FIG. 5 can supply the first current to the organic light emitting diode OLED in response to the data signal, and then the organic light emitting diode OLED can emit light in response to the first current. In the first interval T1a, DC voltages with predetermined values can be supplied from the first power supply EVDD and the second power supply EVSS. A voltage level of the first power supply EVDD may be greater than that of the second power supply EVSS. For example, the voltage level of the first power supply EVDD may be 24V, and the voltage level of the second power supply EVSS may be 0V. However, aspects of the present disclosure are not limited thereto.

In the second interval T2a, a voltage corresponding to a touch driving signal TDS can be transferred to the cathode electrode of the organic light emitting diode OLED. The touch driving signal TDS can include a plurality of pulses. Further, a load free driving signal LFD in synchronism with the touch driving signal TDS may be transferred to the first power supply EVDD. In addition, the load free driving signal LFD may be transferred to a gate line GL and a data line DL. When the load free driving signal LFD is not transferred, since a voltage level in the cathode electrode to which the touch driving signal TDS is transferred has differences from a voltage of the first power supply line VL, a voltage level charged in the gate line GL and a voltage level charged in the data line DL, therefore capacitances can be formed between the cathode electrode and the first power supply line VL, the gate line GL and the data line DL. This causes power consumption of the touch display device 100 to be increased. On the other hand, when the load free driving signal LFD in synchronism with the touch driving signal TDS is applied to the first power supply line VL, the gate line GL and the data line DL, it is possible to prevent such a capacitance from being formed; therefore, it is possible to reduce the power consumption of the touch display device 100. The lines to which the load free driving signal LFD is applied in the display panel 110 are not limited to the first power supply VL, the gate line GL, and the data line DL.

Referring to FIG. 7, one frame period can be divided into a first interval T1b, a second interval T2b, a third interval T3b, and a fourth interval T4b. In the first interval T1b and the third interval T3b, the synchronization signal Tsync can be in the low state, and in the second interval T2b and the forth interval T4b, the synchronization signal Tsync can be in the high state. However, aspects of the present disclosure are not limited thereto. Here, all of the first interval to the fourth interval T1b to T4b can have an identical interval, as in FIG. 7, but aspects of the present disclosure are not limited thereto. Each of the first interval to the fourth interval T1b to T4b may have a different length from one another. In addition, the second interval T2b and the fourth interval T4b can correspond to a vertical blank interval. The vertical blank interval may be an interval during which a vertical synchronizing signal is input, or may be an interval between one row and the next row of a plurality of rows of one frame. In addition, the second interval T2b and the fourth interval T4b can correspond to a long horizontal blank (LAB). 16 long horizontal blanks LAB may be disposed in one frame period. However, aspects of the present disclosure are not limited thereto.

In the first interval T1b and the third interval T3b, a data signal and a gate signal can be transferred to the data line DL and the gate line GL, respectively. Accordingly, the pixel 101 illustrated in FIG. 5 can supply the first current to the organic light emitting diode OLED in response to the data signal, and then the organic light emitting diode OLED can emit light in response to the first current. In the first interval T1b, DC voltages with predetermined values can be supplied from the first power supply EVDD and the second power supply EVSS. A voltage level of the first power supply EVDD may be greater than that of the second power supply EVSS. For example, the voltage level of the first power supply EVDD may be 24V, and the voltage level of the second power supply EVSS may be 0V. However, aspects of the present disclosure are not limited thereto.

In the second interval T2b and the fourth interval T4b, the touch display device can sequentially apply one or more touch driving signals through a touch electrode line TEL corresponding to each of a plurality of cathode electrodes which are electrically separated from one another of the organic light emitting diode OLED, and thus can sense the presence of a touch on the display panel. At this time, a load free driving signal LFD may be applied to cathode electrodes which do not perform sensing. The load free driving signal and the touch driving signal are signals in synchronism with each other, and can be configured with an identical amplitude. Further, a load free driving signal LFD in synchronism with the touch driving signal TDS may be transferred to the first power supply EVDD. In addition, the load free driving signal LFD may be transferred to a gate line GL and a data line DL. The lines to which the load free driving signal LFD is applied in the display panel 110 are not limited thereto.

Figure 8:
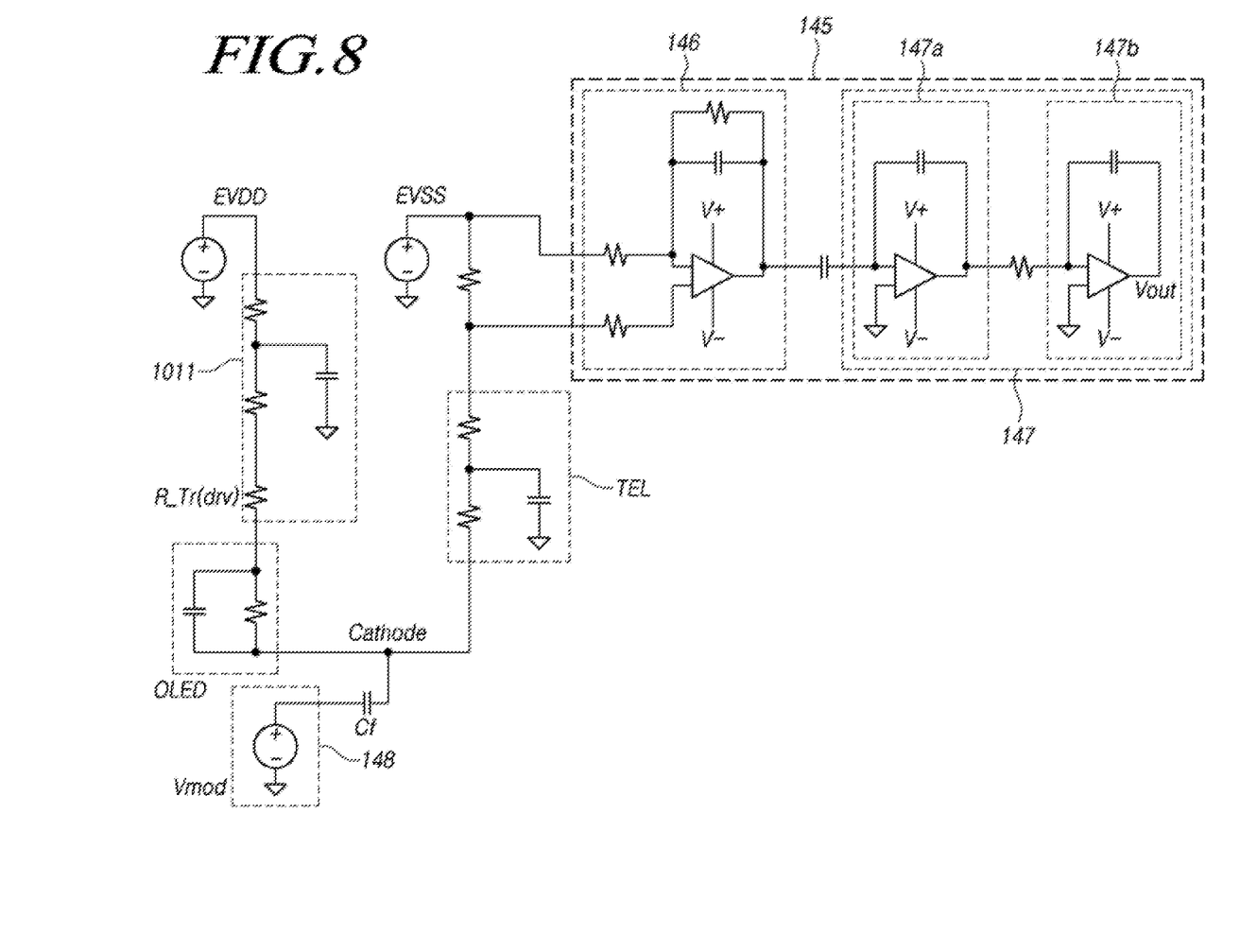
FIG. 8 is a circuit diagram illustrating a connection between the touch circuit and the touch electrode illustrated in FIG. 5.
Figure 9:
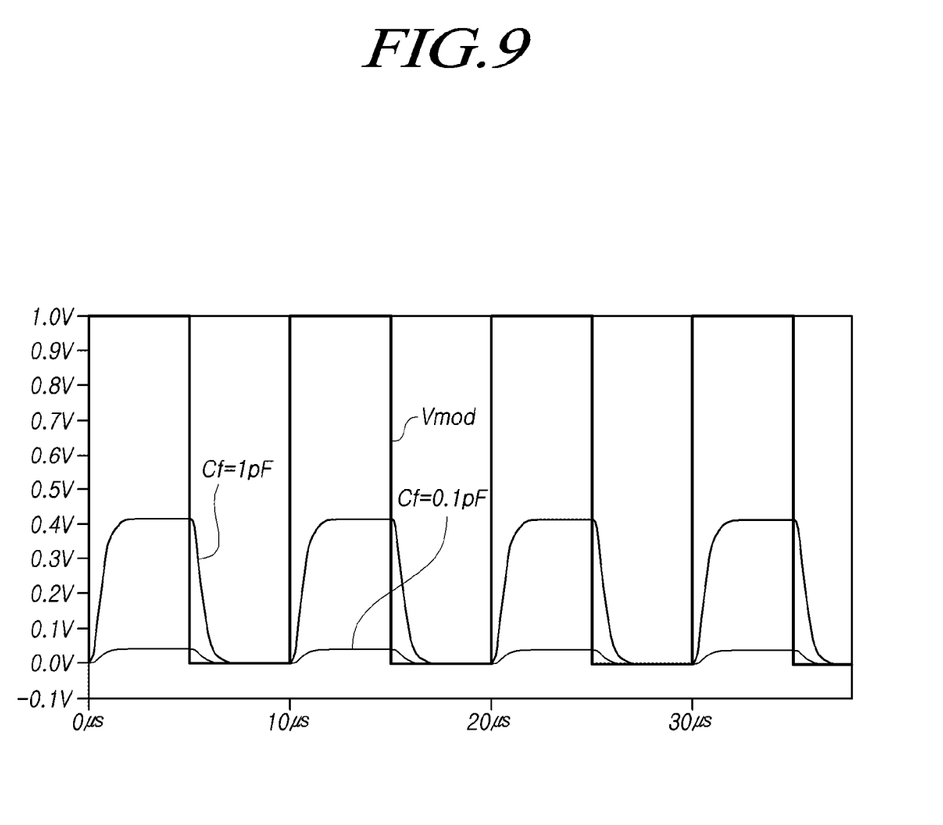
FIG. 9 is a graph illustrating the waveform of a signal applied to the touch circuit and the touch electrode illustrated in FIG. 8.

FIG. 8 is a circuit diagram illustrating a connection between the touch circuit and the touch electrode illustrated in FIG. 5, and FIG. 9 is a graph illustrating the waveform of a signal applied to the touch circuit and the touch electrode illustrated in FIG. 8.

Referring to FIGS. 8 and 9, the touch circuit 145 can include an integrator 146 and a buffer 147. The integrator 146 can calculate a magnitude of a voltage charged in each cathode electrode in response to voltages corresponding to currents flowing by voltages charged in cathode electrodes 125a, 125b, and 125c which are electrically disconnected and a pre-set voltage. The buffer 147 can improve the characteristics of a voltage output from the integrator 146. The buffer 147 can include a first inverter 147a and a second inverter 147b. However, aspects of the present disclosure are not limited thereto.

The touch circuit 145 can be connected to a power supply line connected to the second power supply EVSS. The touch circuit 145 can be connected to the cathode electrode of the organic light emitting diode OLED through a touch line TEL. The organic light emitting diode OLED can be connected to a pixel circuit 1011 generating a first current. Here, R_Tr(drv) represents a resistance corresponding to the first transistor M1 in FIG. 5. A touch capacitor Cf formed by a touch can be connected to the cathode electrode. In addition, a signal applying unit 148 for applying a voltage corresponding to the load free driving signal LFD can be disposed in the cathode electrode.

Here, the load free driving signal LFD is not applied to the first power supply line VL for supplying the first power supply EVDD, the data line DL, and the gate line GL, and a load free driving signal LFD is applied by the signal applying unit 148 to the touch capacitor Cf instead of supplying a touch driving signal TDS to the cathode electrode. A magnitude of the touch capacitor Cf is represented by 1pF or 0.5pF. That is, it can be seen that a magnitude of the output voltage of the touch circuit is different depending on the magnitude of the touch capacitor Cf. Accordingly, it can be seen that a touch can be detected using changes in capacitance caused by a touch.

The disclosure is not limited to the specific features, structures, configurations, and effects described in the present disclosure. A person skilled in the art can apply the features, structures, configurations, and effects illustrated above to other aspects by combining or modifying such features, structures, configurations, and effects. The scope of protection should be construed based on the following claims.

What is claimed is:

1. A touch display device comprising:
 a substrate;
 a planarization film disposed over the substrate;
 an anode electrode and a touch metal disposed on the planarization film;
 a bank disposed over the planarization film on which the anode electrode and the touch metal are disposed, and the bank including a first cavity exposing the anode electrode and a second cavity exposing the touch metal;
 an organic light emitting layer disposed in the first cavity and disposed over the anode electrode;
 a cathode electrode disposed over the organic light emitting layer and the bank, the cathode electrode having a first cathode electrode and a second cathode electrode; and
 a spacer disposed between the first cathode electrode and the second cathode electrode, on the bank,
 wherein the first cathode electrode and the second cathode electrode, which are separated from each other, and a part of the first cathode electrode is disposed in the second cavity and connected to the touch metal,
 wherein the spacer is electrically separated from the first cathode electrode and the second cathode electrode,
 wherein the spacer includes a first spacer and a second spacer,
 wherein the first spacer is adjacent to the second cavity exposing the touch metal, and the first cavity is disposed between the first and second spacers that are disposed on the bank, and
 wherein the organic light emitting layer and the first cathode electrode have a same contour that defines the first cavity, and the first cavity and the second cavity are formed in the bank.

2. The touch display device according to claim 1, wherein the spacer has a cross-sectional shape tapering toward the bank.

3. The touch display device according to claim 1, further comprising:
 a second spacer which is spaced apart from the second cavity, on the bank; and
 a third cathode electrode disposed on the bank and electrically separated from the first cathode electrode by the second spacer.

4. The touch display device according to claim 1, further comprising an encapsulation disposed on the cathode electrode.

5. The touch display device according to claim 1, wherein the first cathode electrode and the second cathode electrode are configured to function as touch electrodes.

6. The touch display device according to claim 1, wherein at least one of the first cathode electrode and the second cathode electrode comprises a plurality of divided cathode electrodes, and the at least one of the first and second cathode electrodes functions as a touch electrode.

7. The touch display device according to claim 6, wherein each of the plurality of divided cathode electrodes corresponds to at least one pixel of the touch display device.

8. The touch display device according to claim 6, wherein a part of one of the divided cathode electrodes is connected to a part of another one of the divided cathode electrodes through a connection electrode, and
wherein the connection electrode is made from a same material as the cathode electrode.

9. The touch display device according to claim 1, further comprising a plurality of pixels, each of the plurality of pixels comprising:
a first transistor for generating a first current in response to a data signal;
a second transistor for transferring the data signal to the first transistor in response to a gate signal;
a storage capacitor for holding the data signal transferred to the first transistor; and
an organic light emitting diode for emitting light by the first current from the first transistor,
wherein, during a first interval, the touch display device is configured to transfer the data signal and the gate signal to a data line and a gate line, respectively,
wherein, during a second interval, the touch display device is configured to transfer a touch driving signal to the cathode electrode of the organic light emitting diode, and a load free driving signal in synchronism with the touch driving signal to at least one of the data line, the gate line, and a power supply line, in order to flow a second current through the cathode electrode.

10. The touch display device according to claim 9, wherein the plurality of pixels includes a first pixel and a second pixel, and
wherein the touch display device is configured to transfer the touch driving signal to a cathode electrode of the first pixel, while transferring the load free driving signal to a cathode electrode of the second pixel, during the second interval.

11. The touch display device according to claim 9, further comprising a touch circuit configured to detect a touch depending on a magnitude of the second current.

12. The touch display device according to claim 9, wherein the touch display device is configured to operate with a plurality of horizontal blank intervals within one frame period, the second interval corresponding to one or more of the plurality of horizontal blank intervals.

13. The touch display device according to claim 9, further comprising a touch capacitor formed by a touch, the touch capacitor is connected to the cathode electrode,
wherein a load free driving signal is applied to the touch capacitor.

14. A touch display device comprising:
a substrate;
a planarization film disposed over the substrate;
an anode electrode and a touch metal disposed on the planarization film;
a bank disposed over the planarization film on which the anode electrode and the touch metal are disposed, and including a first cavity exposing the anode electrode and a second cavity exposing the touch metal;
an organic light emitting layer disposed in the first cavity and disposed over the anode electrode;
a cathode electrode disposed over the organic light emitting layer and the bank, the cathode electrode having a plurality of separated cathode electrodes; and
a plurality of spacers disposed between the plurality of separated cathode electrodes, on the bank,
wherein a part of at least one of the plurality of separated cathode electrodes is disposed in the second cavity and connected to the respective touch metal,
wherein the plurality of spacers are electrically insulated from the plurality of separated cathode electrodes,
wherein the spacer includes a first spacer and a second spacer,
wherein the first spacer is adjacent to the second cavity exposing the touch metal, and the first cavity is disposed between the first and second spacers that are disposed on the bank, and
wherein the organic light emitting layer and the first cathode electrode have a same contour that defines the first cavity, and the first cavity and the second cavity are formed in the bank.

15. The touch display device according to claim 14, wherein the plurality of separated cathode electrodes are configured to function as touch electrodes.

* * * * *